United States Patent
Ernst et al.

(10) Patent No.: US 7,117,404 B2
(45) Date of Patent: Oct. 3, 2006

(54) TEST CIRCUIT FOR TESTING A SYNCHRONOUS MEMORY CIRCUIT

(75) Inventors: Wolfgang Ernst, München (DE); Gunnar Krause, München (DE); Justus Kuhn, München (DE); Jens Lüpke, München (DE); Peter Poechmüller, Colchester, VT (US); Jochen Mueller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 734 days.

(21) Appl. No.: 10/106,414

(22) Filed: Mar. 26, 2002

(65) Prior Publication Data

US 2003/0005361 A1 Jan. 2, 2003

(30) Foreign Application Priority Data

Mar. 30, 2001 (DE) .......................... 101 15 880

(51) Int. Cl.
*G11C 29/00* (2006.01)

(52) U.S. Cl. .................... 714/718; 714/738; 365/201
(58) Field of Classification Search ................ 714/718, 714/798, 814, 719, 744; 365/201; 324/765
See application file for complete search history.

(56) References Cited

U.S. PATENT DOCUMENTS

| | | | | | |
|---|---|---|---|---|---|
| 5,570,381 | A | * | 10/1996 | Schofield ..................... | 714/814 |
| 5,867,447 | A | * | 2/1999 | Koshikawa ................. | 365/233 |
| 5,933,379 | A | * | 8/1999 | Park et al. ................... | 365/201 |
| 6,055,194 | A | * | 4/2000 | Seo et al. .................... | 365/194 |
| 6,400,625 | B1 | * | 6/2002 | Arimoto et al. ............. | 365/201 |
| 6,470,467 | B1 | | 10/2002 | Tomishima et al. | |
| 6,744,272 | B1 | * | 6/2004 | Ernst et al. .................. | 324/765 |
| 6,865,701 | B1 | * | 3/2005 | Youngs et al. .............. | 714/718 |
| 6,865,707 | B1 | * | 3/2005 | Ernst et al. ................. | 714/744 |
| 2002/0157052 | A1 | * | 10/2002 | Ernst et al. ................. | 714/738 |

FOREIGN PATENT DOCUMENTS

JP 2000207900 A 7/2000

OTHER PUBLICATIONS

German Office Action, Nov. 19, 2001 (No translation).

* cited by examiner

*Primary Examiner*—Phung My Chung
(74) *Attorney, Agent, or Firm*—Jenkins, Wilson, Taylor & Hunt, P.A.

(57) ABSTRACT

Test circuit for testing a synchronous memory circuit having a frequency multiplication circuit which multiplies a clock frequency of a low-frequency clock signal received from an external test unit by a particular frequency multiplication factor a test data generator which produces test data on the basis of data control signals received from the external test unit and outputs them to a data output driver a first signal delay circuit for delaying the test data which are output by the test data generator by an adjustable first delay time, a second signal delay circuit for delaying data which are read out of the synchronous memory circuit and are received by a data input driver in the test circuit by an adjustable second delay time, and having a data comparison circuit which compares the test data produced by the test data generator with the data read out of the memory circuit and, on the basis of the comparison result, outputs an indicator signal to the external test unit which indicates whether the synchronous memory circuit to be tested is operable.

6 Claims, 4 Drawing Sheets

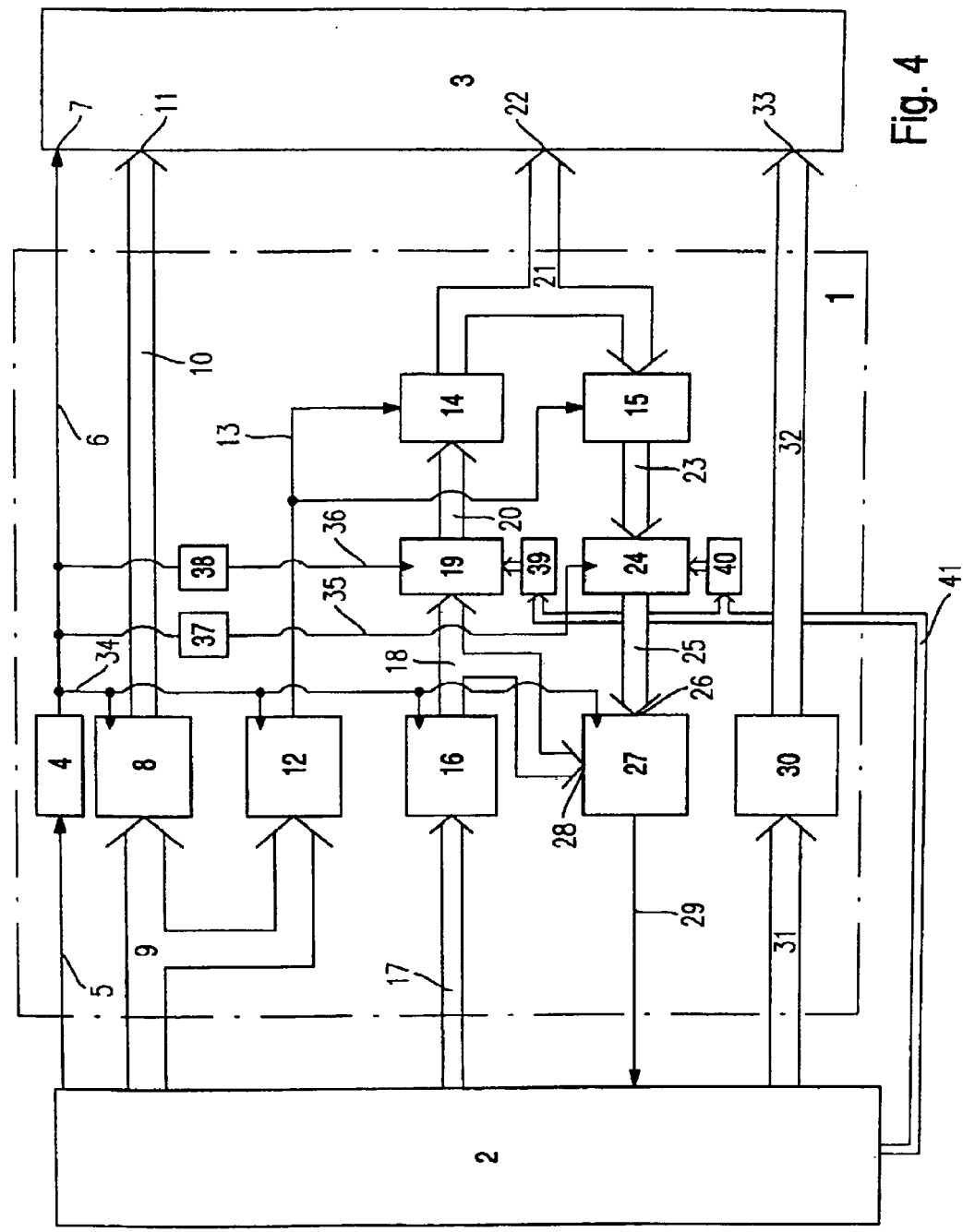

TEST CIRCUIT FOR TESTING A SYNCHRONOUS MEMORY CIRCUIT

TECHNICAL FIELD

The invention relates to a test circuit for testing a synchronous memory circuit, in particular a high-frequency DRAM memory module, in which the latencies can be adjusted for testing.

BACKGROUND ART

Synchronous memory circuits contain a multiplicity of addressable memory cells for storing data. Following the manufacturing process, the memory circuits produced are tested for operability by a test arrangement before they are delivered.

FIG. 1 shows a teat arrangement based on the prior art. The circuit to be tested DUT (DUT: Device Under Test) is clocked with a clock signal CLK via a clock signal line by the external test unit and receives test control signals via a control bus for the purpose of testing a synchronous memory circuit. The test unit uses a data bus to write test data patterns to the memory cells addressed via the address bus and to read them out of the memory cells again. The test unit compares the applied test data with the data which are read out and, on the basis of the data discrepancies established, establishes which memory cells within the synchronous memory are faulty. These memory cells are generally replaced with redundant memory cells by means of readdressing. If the number of faulty memory cells within the synchronous memory circuit is too high, the memory to be rested DUT is disposed of as being irreparable. Testing the synchronous memory DUT involves data being written to the memory and then being read out again.

FIG. 2 shows signal diagrams to illustrate the writing of data to the synchronous memory chip. The memory chip is clocked with a clock signal CLK by the test unit and receives via the control bus a command to write data to the addressed memory cell, After a latency $L_{WR}$, the data to be written $D_{In}$ are applied to the data connection of the synchronous memory chip. For critical testing of the memory chip DUT, the latencies can be adjusted by the external lest unit.

FIG. 3 shows flow diagrams to illustrate the read operation for data from the synchronous memory chip. The memory cells contained in the memory chip are arranged in the form of a matrix and are addressed by means of a row address strobe signal (RAS) and a column address strobe signal (CAS). The RAS control signal, which the test unit applies to the synchronous memory chip via the control bus, indicates that the address present on the address bus is a row address, while a CAS control signal indicates that the address present on the address bus is a column address. Successive application of a column address and a row address allows a specific memory cell to be addressed. The use of an RAS control signal and a CAS control signal allows the width of the address bus to be kept down.

As FIG. 3 reveals, the test unit applies a read command to the synchronous memory chip via the control bus, and the data on the data connections DQ are read out after a CAS latency. In this case, FIG. 3 shows various CAS latencies which can be adjusted by the external test unit.

The synchronous memory chip DUT operates at a particular operating clock frequency CLK. In modern memory chips, the operating clock frequencies are becoming higher and higher and are already in the region of a few hundred megahertz. Conventional test units operate at operating clock frequencies of, by way of example, 100 megahertz and are not able to test such high-frequency memory chips reliably.

SUMMARY OF THE INVENTION

It is therefore the object of the present invention to provide a test circuit for reliably testing a synchronous memory circuit which operates at a very high clock frequency, for which the test latencies are adjustable.

The invention achieves this object by means of a test circuit having the features specified in patent claim 1.

The invention provides a test circuit for testing a synchronous memory circuit having a frequency multiplication circuit which multiplies a clock frequency of a low-frequency clock signal received from an external test unit by a particular frequency multiplication factor in order to produce a high-frequency cloak signal for the Synchronous memory chip, a test data generator which produces test data on the basis of data control signals received from the external test unit and outputs them to a data output driver in order to write them to the synchronous memory circuit, a first signal delay circuit for delaying the test data which are output by the test data generator by an adjustable first delay time, a second signal delay circuit for delaying data which are read out of the synchronous memory circuit to be tested and are received by a data input driver in the test circuit by an adjustable second delay time, and having a data comparison circuit which compares the test data produced by the test data generator with the data read out of the memory circuit and, on the basis of the comparison result, outputs an indicator signal to the external test unit which indicates whether the synchronous memory circuit to be tested is operable.

The use of the inventive test circuit makes it possible to test a synchronous memory which operates at a very high operating clock frequency reliably using a conventional test unit which operates at a low clock frequency.

In one preferred embodiment of the inventive test circuit, the signal delay circuits each have registers for storing the delay times, which can be adjusted by the external test unit via initialization lines.

The signal delay circuits are preferably clocked with the high-frequency clock signal which is output by the frequency multiplication circuit.

The clock signals for clocking the clock signal delay circuit can preferably be delayed themselves.

In one embodiment of the inventive test circuit, the frequency multiplication factor is adjustable.

In one embodiment, the test circuit is integrated in the synchronous memory circuit.

BRIEF DISCRIPTION OF THE DRAWINGS

An embodiment of the inventive test circuit for testing a synchronous memory circuit is explained below with reference to the appended figures, in which:

FIG. 4 shows a test arrangement which contains the inventive test circuit.

DETAILED DESCRIPTION OF THE INVENTION

Figure 1:
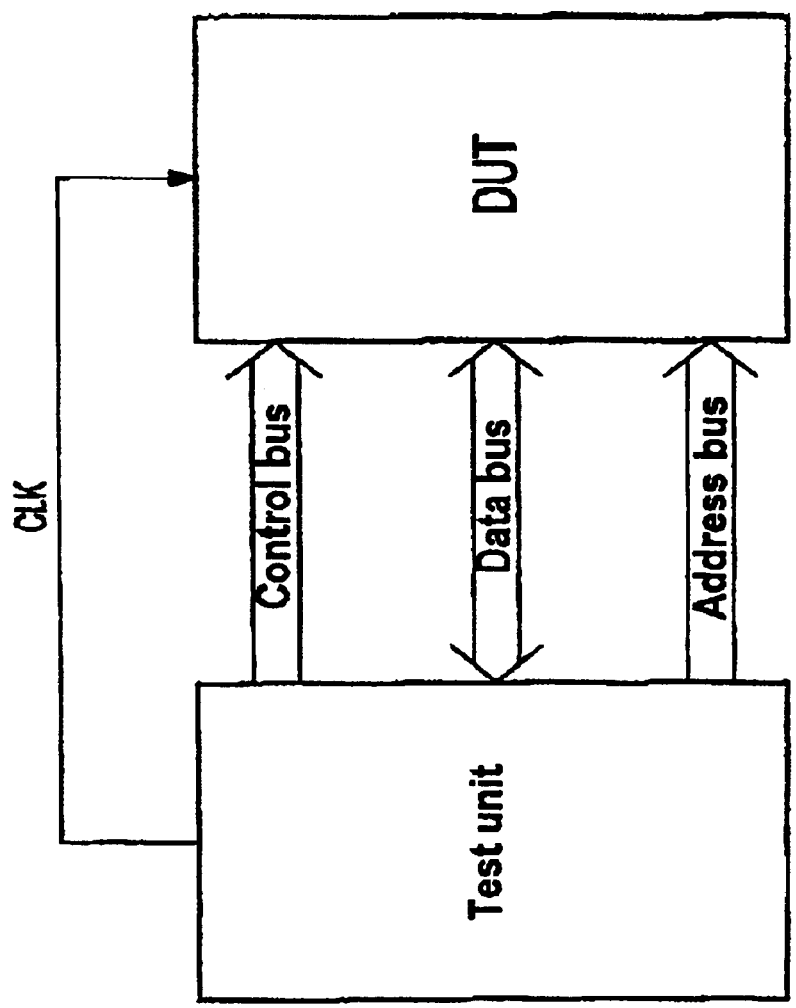
FIG. 1 shows a test arrangement based on the prior art.
Figure 2:
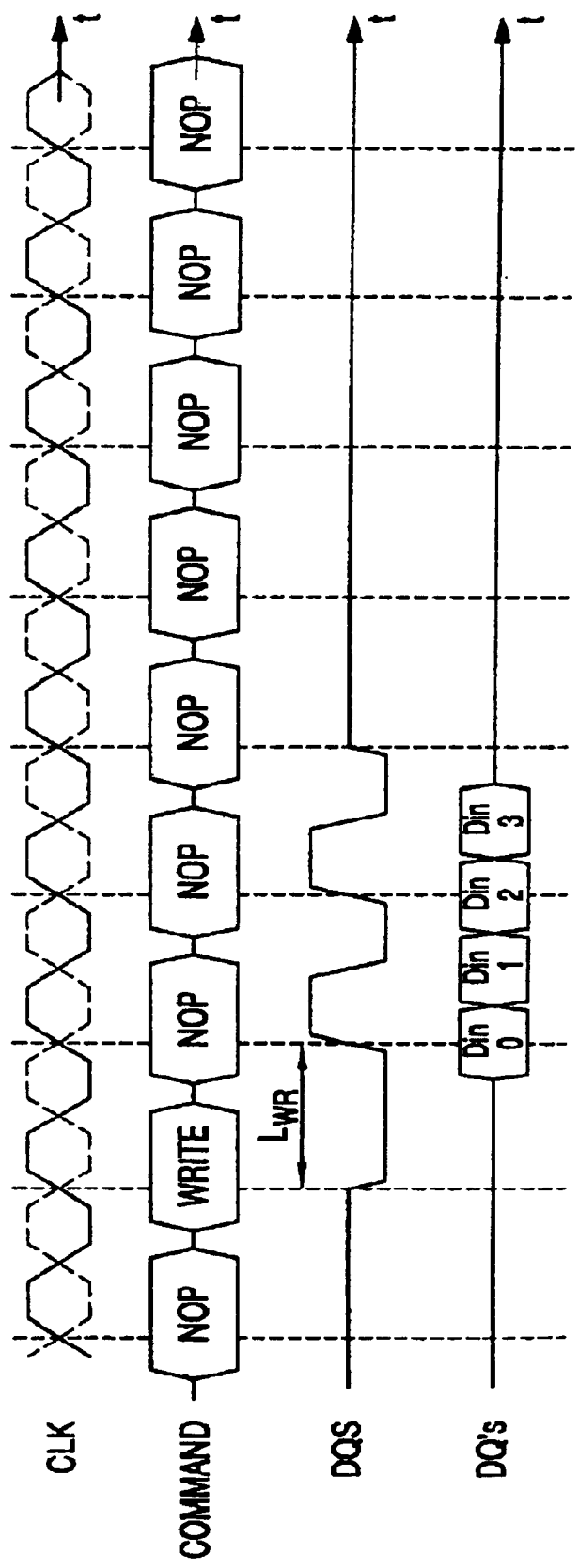
FIG. 2 shows timing diagrams to illustrate the writing of data to a synchronous memory circuit.
Figure 3:
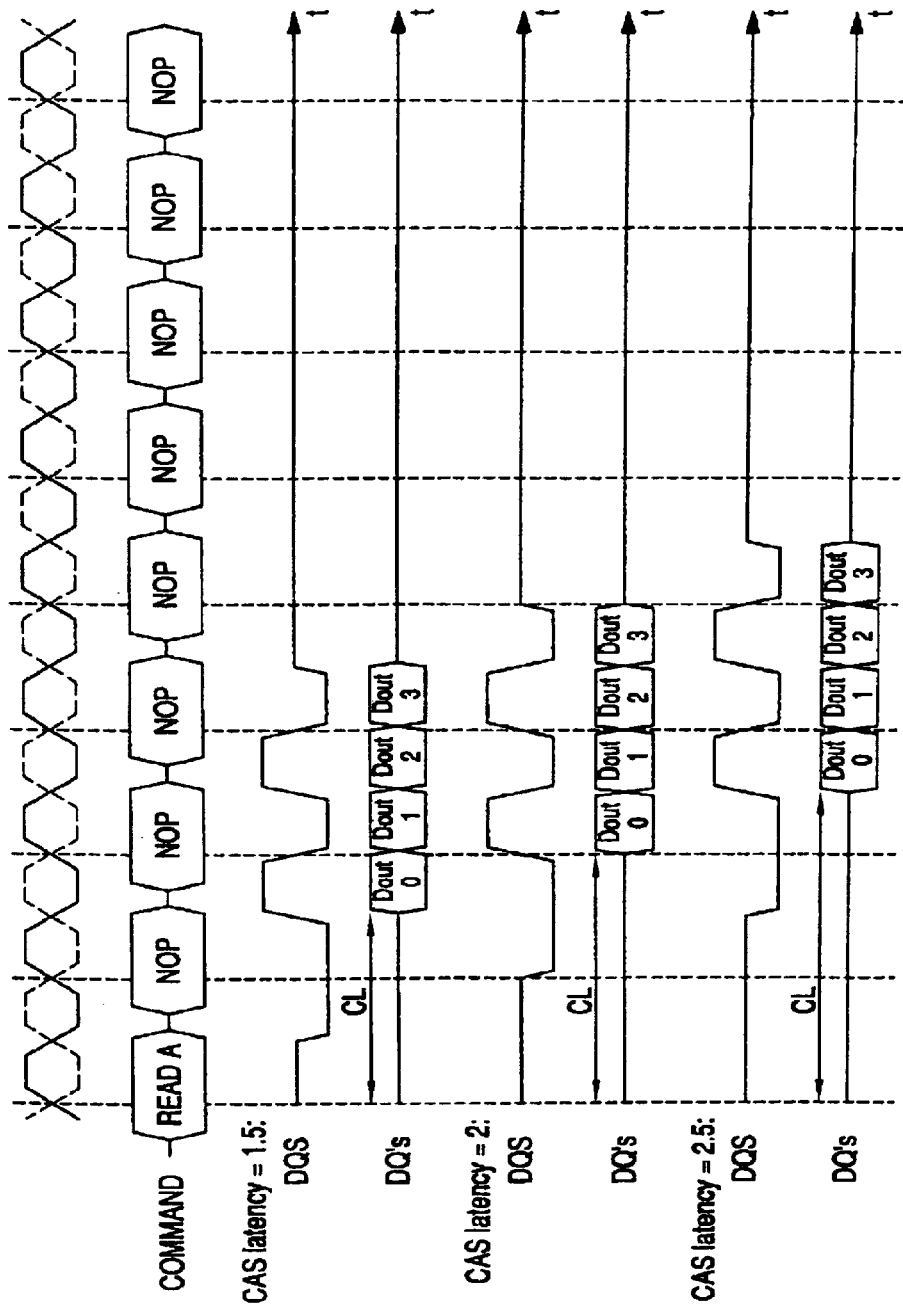
FIG. 3 shows timing diagrams to illustrate the reading of data out of a synchronous memory circuit.

As FIG. 4 reveals, the inventive test circuit 1 is arranged between an external test unit 2 and a synchronous memory circuit 3 to be tested. The test circuit 1 contains a frequency multiplication circuit 4 and receives a relatively low-frequency clock signal of, by way of example, 100 megahertz from the external test unit 2 via a line 5. The frequency multiplication circuit 4 multiplies the clock frequency of the received clock signal by a particular frequency multiplication factor in order to generate a high-frequency clock signal for the synchronous memory chip 3. In this case, the frequency multiplication factor is preferably adjustable and is four, for example. The frequency multiplication circuit 4 outputs the high-frequency clock signal to a clock signal input 7 on the synchronous memory chip 3 via a line 6.

The test circuit 1 also contains a parallel/serial converter 8 which receives control signals relating to the memory chip 3 via control lines 9 from the external test unit 2. In this case, the control signals are transferred from the external rest unit 2 to the parallel/serial converter 8 via the wide control signal bus 9, in each case in parallel via a plurality of control lines, and the parallel/serial converter 8 outputs them serially via a control signal bus 10, having a narrower bus width, to a control input 11 on the circuit to be tested 3. The control signals output by the external test unit 2 via the control line 9 are also output to an evaluation logic unit 12 within the inventive test circuit 1, where they are decoded in order to produce internal control signals. The decoder 12 uses the internal control signals via an internal control signal bus 13 in order to control internal components, namely a data output driver 14 and a data input driver 15. On the basis of the external control signals applied, the evaluation logic unit 12 generates a read/write control signal for actuating the data output driver 14 and the data input driver 15. This makes it possible to obviate additional control lines from the external test unit 2 to the test circuit 1. The test circuit 1 also contains a test data generator 16 which receives data control signals from the external test unit 2 via data control lines 17 and generates test data on the basis thereof. In this case, the test data generator 16 preferably contains registers storing test data patterns. On the basis of the data control signals received for the test data generator 16, these test data patterns are read out at a high clock frequency. The test data patterns read out are output by the test data generator 16 to an internal data bus 18 in the test circuit 1. The generated test data present on the internal data bus 18 are delayed by a first signal delay circuit 19 in the test circuit 1, having an adjustable first delay time, and are applied to the data output driver 14 via data lines 20.

If a write command is applied to the control signal line 13, a data output driver 14 is activated and the test data which are generated by the test data generator 16 and are delayed by the first signal delay circuit 19 are applied via a data bus 21 to a data connection 22 on the synchronous memory 3 to be tested. Conversely, data which are read out of the synchronous memory circuit 3 are applied by the data input driver 15, via data lines 23, to a second signal delay circuit 24, which delays the applied data by at adjustable second delay time. To this end, the data input driver 15 is activated by a read control signal applied to the control signal bus 13.

The received and delayed data which have been read out are applied by the second signal delay circuit 24, via an internal data bus 25, to a first data input 26 of a data comparison circuit 27 which compares the received data with the test data generated by the test data generator 16, which are applied to a second data input 28. The data comparison circuit 27 compares the test data produced by the test data generator with the data which have been read out of the memory circuit 3 and, on the basis of the comparison result, produces an indicator signal which is output to the external test unit 2 via a signal line 29. The indicator signal indicates whether the test data block which has just been written and then read out again contains a data discrepancy indicating that the associated addressed memory cells within the synchronous memory chip are faulty.

The inventive test circuit 1 also preferably contains an address generator 30 which receives address control signals from the external test unit 2 via address control signal lines 31 and, on the basis thereof, produces address signals which are applied via an address bus 32 to an address input 33 on the synchronous memory chip 3 for the purpose of addressing memory cells. The inventive test circuit 1 operates at the high operating clock frequency of the synchronous memory chip 3. To this end, the parallel/serial converter 8, the decoder or the evaluation logic unit 12, the test data generator 16 and the data comparison circuit 27 have clock inputs which are clocked via an internal clock signal line 34 with the high-frequency operating clock signal produced by the frequency multiplication circuit 4.

The first signal delay circuit 19 and the second signal delay circuit 24 are likewise clocked via clock signal lines 35, 36 with the high-frequency operating clock signal, with the clock signal delay elements 37, 38 being able to be delayed by a fixed rime delay.

The first signal delay circuit 19 delays the test data which are output by the test data generator 16 by an adjustable first delay time buffer-stored in a register 39. The second signal delay circuit 24 delays the data read out from the synchronous memory 3 by a second delay time buffer-stored in a register 40. The buffer-stored delay times are initialized by the external test unit 2 during an initialization phase via initialization lines 41 in order to adjust the delay times.

The inventive test circuit 1, as shown in FIG. 4, allows a synchronous memory chip which operates at a very high operating clock frequency of, by way of example, 400 megahertz to be tested reliably by a conventional test unit 2 which operates, by way of example, at a clock frequency of 100 megahertz. In this case, initialization of the registers 39, 40 allows the test latencies to be tested critically according to the specification of the synchronous memory chip. The programmable signal delay in the data's write signal path and read signal path allows the test circuit 1 to send and receive data to and from the memory chip 3 with the adjusted signal delay in units of the clock cycles or fractions thereof. The duration of the signal delay is buffer-stored in the two registers 39, 40. The registers 39, 40 are written to by the external test unit in an initialization phase before the start of the actual actuation of the memory chip 3. In this case, the signal delays in the data's write path and read path can be adjusted independently of one another.

In the embodiment shown in FIG. 4, the signal delay circuit 19 is arranged on the input side of the data output driver 14. In an alternative embodiment, the first signal delay circuit 19 can also be connected downstream of the data output driver 14.

In the embodiment shown in FIG. 4, the second signal delay circuit 24 is arranged downstream of the data input driver 15. In an alternative embodiment, the signal delay circuit 24 is provided on the input side of the data input driver 15.

| List of reference numerals | |
|---|---|
| 1 | Test circuit |
| 2 | External test unit |
| 3 | Circuit to be tested |
| 4 | Frequency multiplication circuit |
| 5 | Clock signal line |
| 6 | Clock signal line |
| 7 | Clock input |
| 8 | Parallel/serial converter |
| 9 | Control lines |
| 10 | Control bus |
| 11 | Control input |
| 12 | Evaluation logic unit |
| 13 | Internal control lines |
| 14 | Data output driver |
| 15 | Data input driver |
| 16 | Test data generator |
| 17 | Data control lines |
| 18 | Internal data bus |
| 19 | Clock time delay circuit |
| 20 | Internal data lines |
| 21 | Data bus |
| 22 | Data input |
| 23 | Data lines |
| 24 | Second signal delay circuit |
| 25 | Internal data bus |
| 26 | Data input |
| 27 | Data comparison circuit |
| 28 | Data input |
| 29 | Indicator line |
| 30 | Address generator |
| 31 | Address control lines |
| 32 | Address bus |
| 33 | Address input |
| 34 | Clock signal line |
| 35 | Clock signal line |
| 36 | Clock signal line |
| 37 | Delay circuit |
| 38 | Delay circuit |
| 39 | Register |
| 40 | Register |
| 41 | Initialization lines |

What is claimed is:

1. Test circuit for testing a synchronous memory circuit having:

(a) a frequency multiplication circuit which multiplies a clock frequency of a low-frequency clock signal received from an external test unit by a particular frequency multiplication factor in order to produce a high-frequency clock signal for the synchronous memory chip to be tested;

(b) a test data generator which produces test data on the basis of data control signals received from the external test unit and outputs them to a data output driver in order to write them to the synchronous memory circuit to be tested, wherein in the test data generator test data patterns are stored which are read out at a frequency of the high-frequency clock signal to produce the test data;

(c) a first signal delay circuit for delaying the test data which are output by the test data generator by an adjustable first delay time;

(d) a second signal delay circuit for delaying data which are read out of the synchronous memory circuit to be tested and are received by a data input driver in the test circuit by an adjustable second delay time;

(e) and having a data comparison circuit which compares the test data produced by the test data generator with the data read out of the memory circuit and, on the basis of the comparison result, outputs an indicator signal to the external test unit which indicates whether the synchronous memory circuit to be tested is operable.

2. Test circuit according to claim 1, wherein the signal delay circuits are connected to a register for storing the delay times, with the delay times being able to be adjusted by the external test unit via initialization lines.

3. Test circuit according to claim 1, wherein the signal delay circuits are clocked with the high-frequency clock signal which is output by the frequency multiplication circuit.

4. Test circuit according to claim 3, wherein the clock signals for clocking the signal delay circuits can be delayed.

5. Test circuit according to claim 1, wherein the frequency multiplication factor is adjustable.

6. Test circuit according to claim 1, wherein the test circuit is integrated in the synchronous memory circuit.

* * * * *